US007968417B2

(12) United States Patent
Preisler

(10) Patent No.: US 7,968,417 B2
(45) Date of Patent: Jun. 28, 2011

(54) METHOD FOR INTEGRATING HIGH VOLTAGE AND HIGH SPEED BIPOLAR TRANSISTORS ON A SUBSTRATE AND RELATED STRUCTURE

(75) Inventor: Edward Preisler, San Clemente, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 12/221,597

(22) Filed: Aug. 4, 2008

(65) Prior Publication Data
US 2009/0085066 A1   Apr. 2, 2009

Related U.S. Application Data

(60) Provisional application No. 60/997,113, filed on Oct. 1, 2007.

(51) Int. Cl.
*H01L 21/8222* (2006.01)
*H01L 27/082* (2006.01)

(52) U.S. Cl. ...................... 438/340; 257/566

(58) Field of Classification Search .......... 438/340, 438/370, 312; 257/566, 197, 553
See application file for complete search history.

(56) References Cited

U.S. PATENT DOCUMENTS 4,379,726 A * 4/1983 Kumamaru et al. .......... 438/340
6,977,426 B1 * 12/2005 Gomi et al. .................. 257/553
* cited by examiner

*Primary Examiner* — Mark Prenty
(74) *Attorney, Agent, or Firm* — Farjami & Farjami LLP

(57) ABSTRACT

According to an exemplary embodiment, a method for integrating a high speed bipolar transistor in a high speed transistor region of a substrate with a high voltage transistor in a high voltage transistor region of the substrate includes forming a buried subcollector in the high speed transistor region of the substrate. The method further includes forming a first high energy implant region in the high voltage transistor region of the substrate, where the first high energy implant region extends to a depth greater than a depth of a peak dopant concentration of the buried subcollector, thereby increasing a collector-to-emitter breakdown voltage of the high voltage transistor. The collector-to-emitter breakdown voltage of the high voltage transistor can be greater than approximately 5.0 volts. The high speed bipolar transistor can have a cutoff frequency of greater approximately 200.0 GHz.

20 Claims, 8 Drawing Sheets

METHOD FOR INTEGRATING HIGH VOLTAGE AND HIGH SPEED BIPOLAR TRANSISTORS ON A SUBSTRATE AND RELATED STRUCTURE

The present application claims the benefit of and priority to a pending provisional patent application entitled "Integration of High Voltage and High Frequency Bipolar Transistors," Ser. No. 60/997,113 filed on Oct. 1, 2007. The disclosure in that pending provisional application is hereby incorporated fully by reference into the present application.

BACKGROUND OF THE INVENTION

1. Field of the Invention

The present invention is generally in the field of semiconductor device fabrication. More particularly, the invention is in the field of semiconductor transistor fabrication.

2. Background Art

Integrated analog circuit designs often require multiple types of bipolar transistors that operate at different voltages to optimize different circuit blocks on a single semiconductor die. As a result, integrated circuit (IC) manufacturers have developed processes that allow high speed transistors with a relatively low breakdown voltage to be manufactured on the same semiconductor die as lower speed transistors with a high breakdown voltage. As a result of continuing advances in bipolar transistor technology, high speed transistors have been fabricated with a cutoff frequency ($F_T$) of 200.0 megahertz (MHz) or greater. To fabricate these state of the art high speed bipolar transistors, a very thin epitaxial collector layer, which is formed over a highly doped, buried subcollector, is required to reduce collector transit time and collector resistance. However, the thickness of the epitaxial collector layer sets an upper limit on the collector-to-emitter breakdown voltage ($BV_{CEO}$) of high voltage bipolar transistors that are to be fabricated on the same semiconductor substrate as the high speed bipolar transistors.

In a conventional bipolar fabrication process, for example, a high voltage transistor fabricated on the same semiconductor substrate with a high speed bipolar transistor having an $F_T$ of approximately 200.0 MHz or greater is generally limited to a $BV_{CEO}$ of between 3.0 volts and 4.0 volts. Although high voltage bipolar transistors having a $BV_{CEO}$ greater than 5.0 volts and high speed bipolar transistors having an $F_T$ of 200.0 MHz or greater can be integrated on the same die by growing separate epitaxial collector layers with different thicknesses, this conventional approach significantly increases manufacturing cost. Thus, a novel process for integrating high speed bipolar transistors having an $F_T$ of 200.0 MHz or greater with high voltage bipolar transistors having a $BV_{CEO}$ greater than 5.0 volts on a semiconductor substrate at a low manufacturing cost is highly desirable.

SUMMARY OF THE INVENTION

Method for integrating high voltage and high speed bipolar transistors on a substrate and related structure, substantially as shown in and/or described in connection with at least one of the figures, as set forth more completely in the claims.

DETAILED DESCRIPTION OF THE INVENTION

The present invention is directed to a method for integrating high voltage and high speed bipolar transistors on a substrate and related structure. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

The present invention involves an innovative method of integrating high speed bipolar transistors, such as high speed silicon germanium (SiGe) NPN transistors, with high voltage bipolar transistors, such as SiGe high voltage NPN transistors, on a semiconductor substrate. As will be discussed in detail below, by forming a high energy implant region significantly below an epitaxial layer to replace a conventional buried subcollector, the present invention advantageously achieves a high voltage bipolar transistor having a $BV_{CEO}$ greater than 5.0 volts that can be integrated on the same substrate with a high speed bipolar transistor having an $F_T$ (cutoff frequency) of 200.0 MHz or greater. The present invention can be advantageously utilized in, for example, wireless or optical network applications, or other applications that require the integration of high speed and high voltage bipolar transistors on the same semiconductor substrate.

Figure 1:
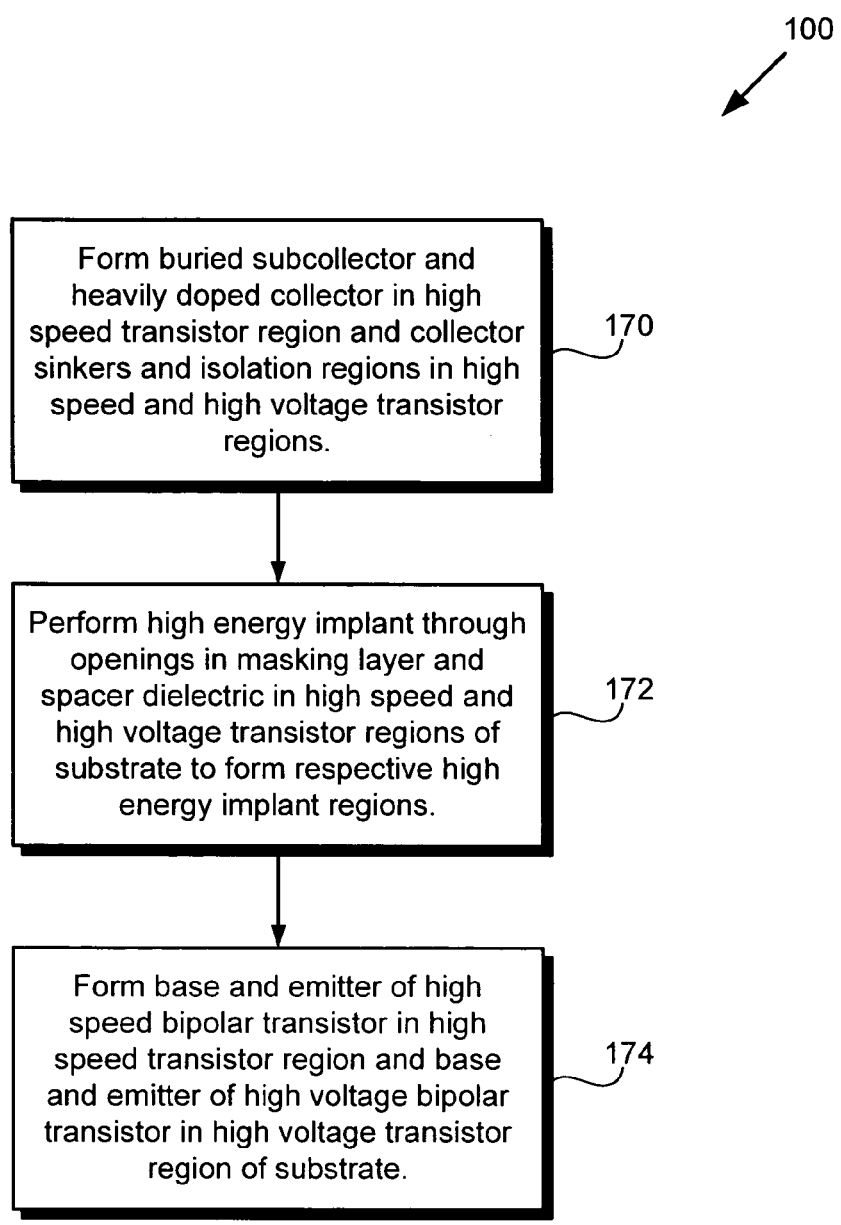
FIG. 1 shows a flowchart illustrating the steps taken to implement an embodiment of the present invention.

FIG. 1 shows a flowchart illustrating an exemplary method according to an embodiment of the present invention. Certain details and features have been left out of flowchart 100 that are apparent to a person of ordinary skill in the art. For example, a step may consist of one or more substeps or may involve specialized equipment or materials, as known in the art. Steps 170 through 174 indicated in flowchart 100 are sufficient to describe one embodiment of the present invention, other embodiments of the invention may utilize steps different from those shown in flowchart 100. It is noted that the processing steps shown in flowchart 100 are performed on a wafer, which, prior to step 170, includes a silicon substrate having high speed transistor region for fabricating high speed bipolar transistors and a high voltage transistor region for fabricating high voltage bipolar transistors. It is also noted that, prior to step 170, the silicon substrate can also include a complementary metal-oxide semiconductor (CMOS) region (not shown in any of the figures) for CMOS transistor fabrication.

Figure 2A:
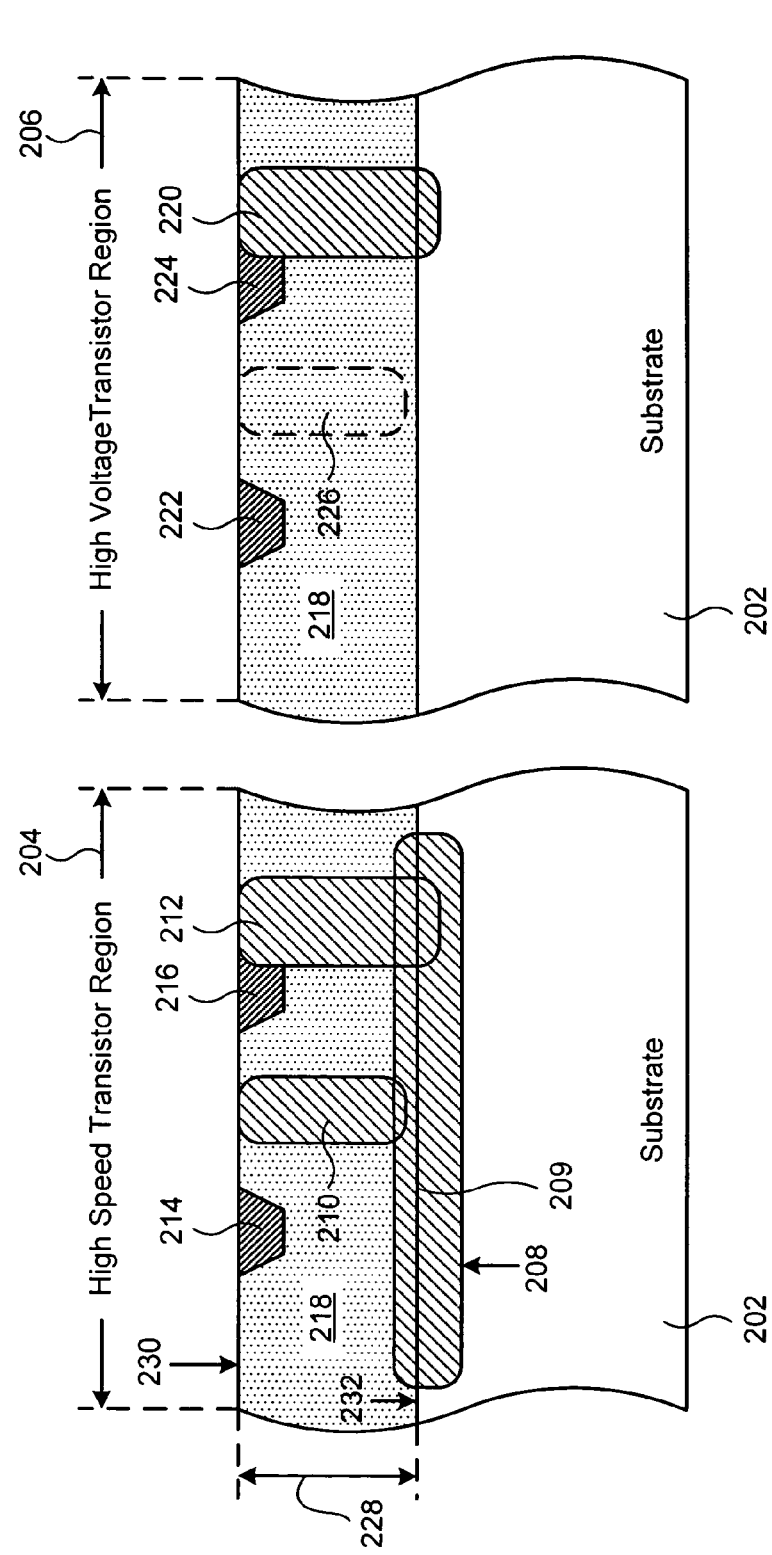
FIG. 2A illustrates a cross-sectional view, which includes a portion of a wafer processed according to an embodiment of the invention, corresponding to an initial step in the flowchart in FIG. 1.
Figure 2B:
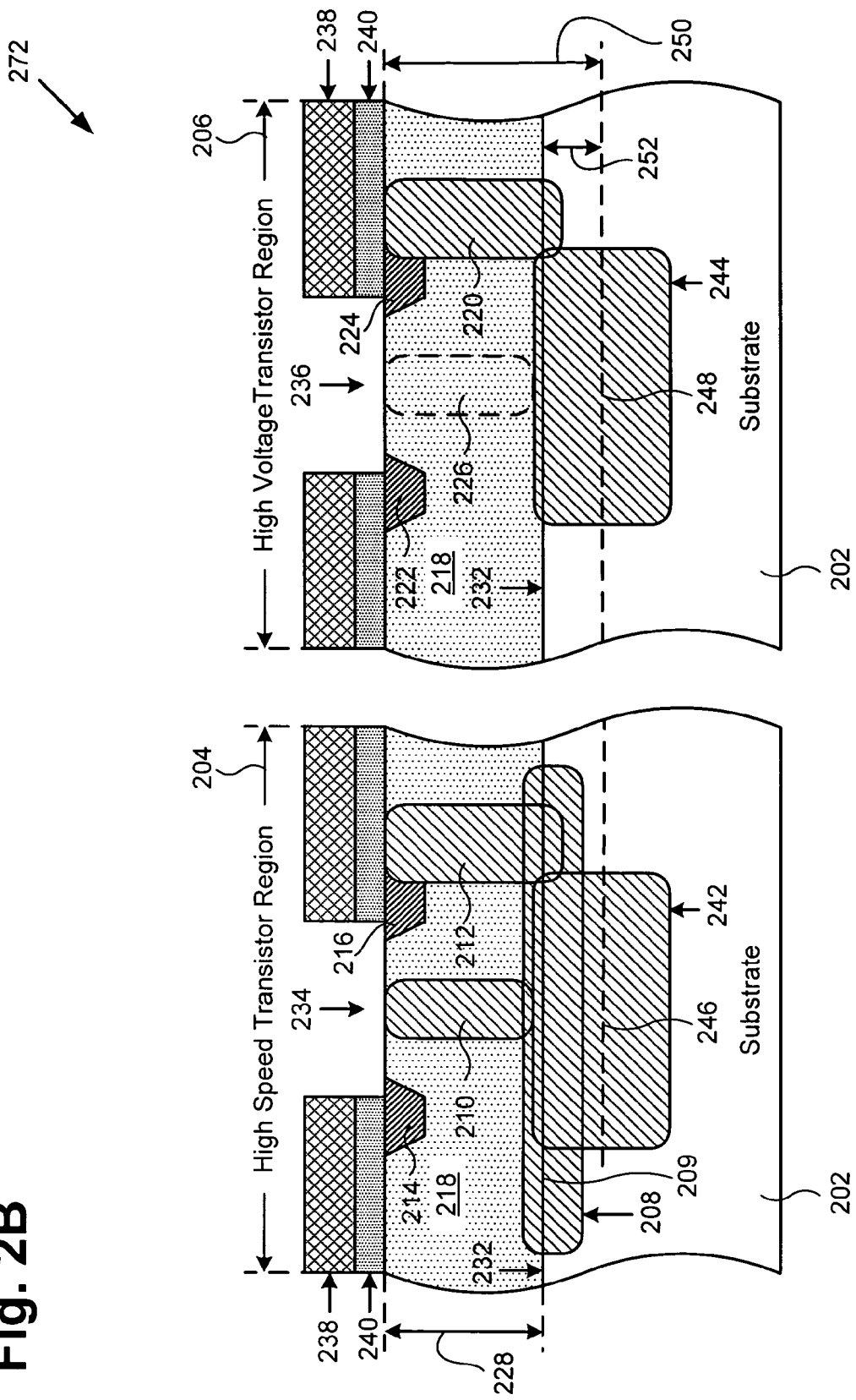
FIG. 2B illustrates a cross-sectional view, which includes a portion of a wafer processed according to an embodiment of the invention, corresponding to an intermediate step in the flowchart in FIG. 1.
Figure 2C:
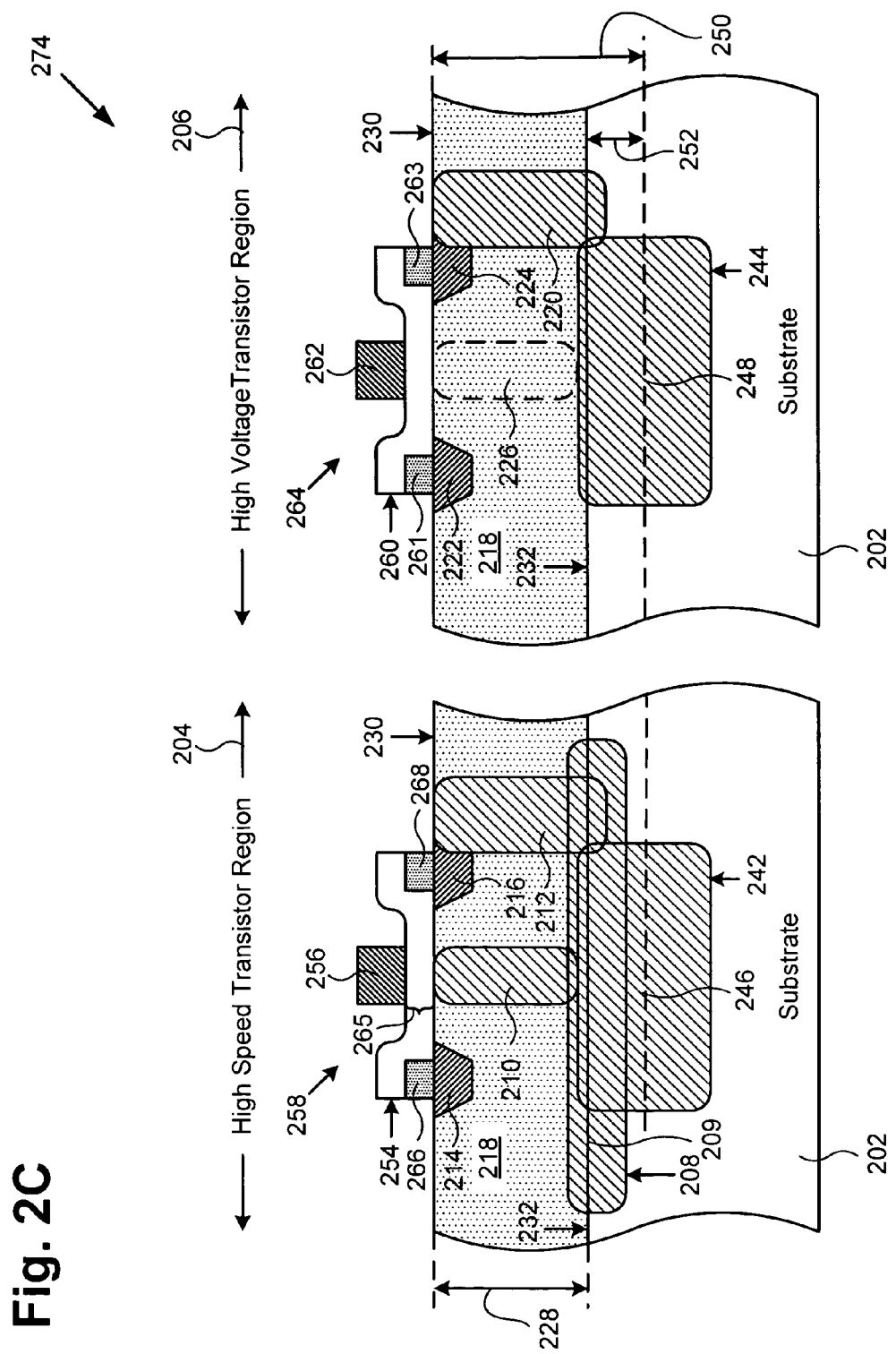
FIG. 2C illustrates a cross-sectional view, which includes a portion of a wafer processed according to an embodiment of the invention, corresponding to a final step in the flowchart in FIG. 1.

Moreover, structures 270 through 274 in FIGS. 2A through 2C illustrate the result of performing, on the semiconductor structure discussed above, steps 170 through 174 of flowchart 100, respectively. For example, structure 270 shows the semiconductor structure discussed above after processing step 170, structure 272 shows structure 270 after the processing of step 172, and so forth. It is noted that although formation of only one high speed bipolar transistor and only one high voltage bipolar transistor are specifically discussed herein to preserve brevity, multiple high speed and high voltage bipolar transistors can be formed in respective high speed and high voltage transistor regions of a silicon substrate utilizing the innovative process of the present invention.

Referring now to FIG. 2A, structure 270 of FIG. 2A shows an exemplary structure including a silicon substrate that includes high speed and high voltage transistor regions, after completion of step 170 of flowchart 100 in FIG. 1. In structure 270, substrate 202 includes high speed transistor region 204 for fabricating high speed bipolar transistors, such as high speed SiGe heterojunction bipolar transistors (HBTs), and high voltage transistor region 206 for fabricating high voltage bipolar transistors, such as high voltage SiGe HBTs.

Referring now to step 170 in FIG. 1 and structure 270 in FIG. 2A, at step 170 of flowchart 100, buried subcollector 208, a heavily doped collector (i.e. collector 210), collector sinker 212, and isolation regions 214 and 216 are formed in high speed transistor region 204 and collector sinker 220 and isolation regions 222 and 224 are formed in high voltage transistor region 206. As shown in FIG. 2A, epitaxial layer 218 is situated over substrate 202 in high speed transistor region 204 and high voltage transistor region 206, can comprise single crystal silicon, and can be lightly doped with a suitable N type dopant. Epitaxial layer 218 has thickness 228, which can be selected to be sufficiently thin so as to enable a high speed bipolar transistor having an $F_T$ (cutoff frequency) approximately equal to 200.0 MHz or greater to be formed in high speed transistor region 204. For example, thickness 228 can be equal to approximately 0.45 micron in one embodiment. Epitaxial layer 218 can be formed by epitaxially growing a layer of silicon on substrate 202 in a manner known in the art.

Also shown in FIG. 2A, collector 226 is situated in epitaxial layer 218 in high voltage transistor region 206 and comprises a portion of epitaxial layer 218 that is situated between isolation regions 222 and 224. In the present embodiment, collector 226 is a lightly doped N type collector comprising substantially the same concentration of N type dopant as epitaxial layer 218. Thus, in the present embodiment, collector 226 does not receive any additional collector doping via a local collector implant. In one embodiment, collector 226 can comprise a higher concentration of N type dopant than epitaxial layer 218.

Further shown in FIG. 2A, buried subcollector 208 is situated in substrate 202, extends into epitaxial layer 218, and can be heavily doped with an N type dopant. Buried subcollector 208 has peak dopant concentration 209, which is situated close to top surface 232 of substrate 202 (or bottom surface 232 of epitaxial layer 218). Buried subcollector 208 has an intended depth below top surface 230 of epitaxial layer 218 that is approximately equal to thickness 228 of epitaxial layer 218, which corresponds to a depth of peak dopant concentration 209. Buried subcollector 208 can be formed by utilizing a shallow, low energy implant to implant a heavy dose of N type dopant into top surface 232 of substrate 202 prior to formation of epitaxial layer 218. The shallow, low energy implant can be performed at a sufficiently low energy so as to provide a heavily doped N type region having a peak concentration of N type dopant at (i.e. close to) top surface 232 of substrate 202. After the shallow, low energy implant has been performed, epitaxial layer 218 can be formed on substrate 202. As a result, epitaxial layer 218 "buries" the heavily doped N type region, thereby forming buried subcollector 208. In the present invention, a buried subcollector, such as buried subcollector 208, is not formed in high voltage transistor region 206.

Also shown in FIG. 2A, collector 210 is situated in epitaxial layer 218 in high speed transistor region 204 and can comprise a heavily doped N type region. Collector 210 can be formed by implanting a heavy dose of N type dopant in epitaxial layer 218 between isolation regions 214 and 216 in a manner known in the art. Further shown in FIG. 2A, collector sinkers 212 and 220 are situated in epitaxial layer 218 in respective high speed and high voltage transistor regions 204 and 206 and can comprise heavily doped N type regions. Collector sinker 212 is electrically connected to collector 210 by buried subcollector 208 and collector sinker 220 is electrically connected to collector 226 by a subsequently formed high energy implant region. Collector sinkers 212 and 220 can be formed by implanting a heavy dose of N type dopant into epitaxial layer 218.

Also shown in FIG. 2A, isolation regions 214 and 216 are situated in epitaxial layer 218 in high speed transistor region 204 and isolation regions 222 and 224 are situated in epitaxial layer 218 in high voltage transistor region 206. Isolation regions 214, 216, 222, and 224 can comprise deposited silicon oxide and can be shallow trench isolation (STI) regions. Isolation regions 214 and 216 define an active area for formation of a high speed bipolar transistor, such as a high speed SiGe NPN transistor, and isolation regions 222 and 224 define an active area for formation of a high voltage bipolar transistor, such as a high voltage SiGe NPN transistor. The result of step 170 of flowchart 100 is illustrated by structure 270 in FIG. 2A.

Referring now to step 172 in FIG. 1 and structure 272 in FIG. 2B, at step 172 of flowchart 100, a high energy implant comprising a high dose of N type dopant is performed through openings 234 and 236 in masking layer 238 and spacer dielectric 240 in high speed and high voltage transistor regions 204 and 206 of substrate 202 to form respective high energy implant regions 242 and 244. As shown in FIG. 2B, high energy implant region 242 is situated is situated below collector 210 in substrate 202 in high speed transistor region 204 and high energy implant region 244 is situated below collector 226 in substrate 202 in high voltage transistor region 206. High energy implant region 242 comprises a heavily doped N type region including peak dopant concentration 246 and high energy implant region 244 comprises a heavily doped N type region including peak dopant concentration 248. Peak dopant concentrations 246 and 248 are situated at depth 250 below top surface 230 of epitaxial layer 218 and at depth 252 below top surface 232 of substrate 202. In high speed transistor region 204, peak dopant concentration 246 of high energy implant region 242 is situated significantly deeper in substrate 202 than peak dopant concentration 209 of buried subcollector 208.

Thus, depth 250 of peak dopant concentrations 246 and 248 is significantly greater than the depth of peak dopant concentration 209, which is approximately equal to thickness 228 of epitaxial layer 218. In the present invention, the depth of the peak dopant concentration of a high energy implant region, such as peak dopant concentration 248 of high energy implant region 244, is selected so as to cause a high voltage bipolar transistor formed in the high voltage transistor region of the substrate to have a $BV_{CEO}$ greater than 5.0 volts.

Also shown in FIG. 2B, spacer dielectric 240 is situated over epitaxial layer 218 and masking layer 238 is situated over spacer dielectric 240 in high speed and high voltage transistor regions 204 and 206. Spacer dielectric 240 can comprise, for example, a layer of nitride situated over a layer of oxide and can be deposited over epitaxial layer 218 by using a chemical vapor deposition (CVD) process or other suitable deposition process. Spacer dielectric 240 can be utilized to form spacers in a CMOS region (not shown in any of the figures) of substrate 202. Masking layer 238 can comprise photoresist or other suitable masking material and can be deposited over spacer dielectric 240 in a manner know in the art. Masking layer 238 and spacer dielectric 240 can be patterned to form openings 234 and 236 in respective high speed and high voltage transistor regions 204 and 206 for base layer formation and for forming high energy implant regions 242 and 244.

High energy implant regions 242 and 244 can be formed by implanting a high dose of N type dopant at high implant energy into substrate 202 through respective openings 234 and 236. For example, a dose of N type dopant of approximately $10^{14}$ ions per cm$^2$ can be implanted through openings 234 and 236 in the high energy, high dose implant. For example, an energy of approximately 1.0 megavolt can be utilized to perform the high energy, high dose implant. In one embodiment, a high energy implant region, such as high energy implant region 244, is only formed in high voltage transistor region 206. In high voltage transistor region 206, high energy implant region 244 forms an implanted subcollector and provides an electrical connection between collector 226 and collector sinker 220. In the embodiment in FIGS. 1 and 2A through 2C, the formation of high energy implant regions 242 and 244 involves using the same masking layer (i.e. masking layer 238) that is utilized for base layer formation. Thus, in this embodiment, a separate masking layer is not required to form high energy implant regions 242 and 244, which advantageously reduces manufacturing cost. The result of step 172 of flowchart 100 is illustrated by structure 272 in FIG. 2B.

Referring now to step 174 in FIG. 1 and structure 274 in FIG. 2C, at step 174 of flowchart 100, base 254 and emitter 256 of high speed bipolar transistor 258 are formed in high speed transistor region 204 of substrate 202 and base 260 and emitter 262 of high voltage bipolar transistor 264 are formed in high voltage transistor region 206 of substrate 202. As shown in FIG. 2C, base 254 is situated over collector 210 and over spacer dielectric segments 266 and 268 in high speed transistor region 204 and base 260 is situate over collector 226 and spacer dielectric segments 261 and 263 in high voltage transistor region 206. Bases 254 and 260 can each comprise, for example, SiGe (silicon germanium), which can be doped with boron or other suitable P type dopant, and have thickness 265. In one embodiment, bases 254 and 260 can each comprise a semiconductor material other than silicon germanium.

Bases 254 and 260 can be formed, for example, by depositing a layer of silicon germanium in respective openings 234 and 236 and over spacer dielectric 240 by utilizing a suitable deposition process after masking layer 238 (shown in FIG. 2B) has been removed and appropriately patterning the layer of silicon germanium. Bases 254 and 260 can each comprise single crystal silicon germanium on epitaxial layer 218 and can each comprise polycrystalline silicon germanium over the spacer dielectric. Spacer dielectric 240 can be patterned, for example, concurrently with the layer of silicon germanium. Thickness 265 of base 254 can be appropriately selected to enable high speed bipolar transistor 258 to achieve an $F_T$ (cutoff frequency) of approximately 200.0 MHz or greater.

Also shown in FIG. 2C, emitter 256 is situated over base 254 in high speed transistor region 204 and emitter 262 is situated over base 260 in high voltage transistor region 206. Emitters 256 and 262 can each comprise polycrystalline silicon (polysilicon), which can be doped with an appropriate N type dopant, such as arsenic. Emitters 256 and 262 can be formed by depositing a layer of polysilicon by using a CVD process or other suitable deposition process and appropriately patterning the layer of polysilicon. Thus, in the present embodiment, high speed bipolar transistor 258, which comprises emitter 256, base 254, and collector 210, is formed in high speed transistor region 204 and high voltage bipolar transistor 264, which comprises emitter 262, base 260, and collector 226, is formed in high voltage transistor region 206. In the present embodiment, high speed bipolar transistor 258 can be a high speed SiGe HBT and high voltage bipolar transistor 264 can be a high voltage SiGe HBT. The result of step 174 of flowchart 100 is illustrated by structure 274 in FIG. 2C.

In the embodiment in FIGS. 1 and 2A through 2C, by appropriately selecting thickness 228 of epitaxial layer 218 and thickness 265 of base 254 and forming a heavily doped collector (i.e. collector 210), high speed bipolar transistor 258 can provide an $F_T$ of approximately 200.0 MHz or greater and a $BV_{CEO}$ (collector-to-emitter breakdown voltage) of approximately 1.8 volts. Since high speed bipolar transistor 258 includes a heavily doped collector (i.e. collector 210), high energy implant region 242 does not have a significant effect on the performance of high speed bipolar transistor 258. By forming high energy implant region 244 under a very lightly doped collector (i.e. collector 226) in place of a conventional buried subcollector, such as buried subcollector 208, and selecting depth 250 of peak dopant concentration 248 of high energy implant region 244 to be significantly below top surface 232 of substrate 202, an embodiment of the invention's high voltage bipolar transistor 264 can provide a $BV_{CEO}$ greater than 5.0 volts and an $F_T$ of approximately 45.0 MHz. In one embodiment, high voltage bipolar transistor 265 can provide a $BV_{CEO}$ of between approximately 5.5 volts and approximately 6.0 volts.

In contrast, in a conventional integration process, where a high speed bipolar transistor having an $F_T$ of approximately 200.0 MHz or greater is integrated with a conventional high voltage bipolar transistor including a conventional buried subcollector, such as buried subcollector 208, the conventional high voltage bipolar transistor is limited to a $BV_{CEO}$ of less than 4.0 volts, even by utilizing a collector having a minimum dopant concentration.

Thus, by utilizing a high energy implant region (e.g. high energy implant region 244), which forms an implanted subcollector, in place of a conventional buried subcollector (e.g. buried subcollector 208), the invention can advantageously integrate a high speed bipolar transistor having an $F_T$ of approximately 200.0 MHz or greater with a high voltage bipolar transistor having a $BV_{CEO}$ greater than 5.0 volts on the same semiconductor die substrate. Also, in the embodiment of the invention in FIGS. 1 and 2A through 2C, a high speed bipolar transistor having an $F_T$ of approximately 200.0 MHz or greater is integrated with a high voltage bipolar transistor having a $BV_{CEO}$ greater than 5.0 volts on the same semiconductor die substrate without requiring an additional masking layer, which reduces manufacturing cost.

Figure 3:
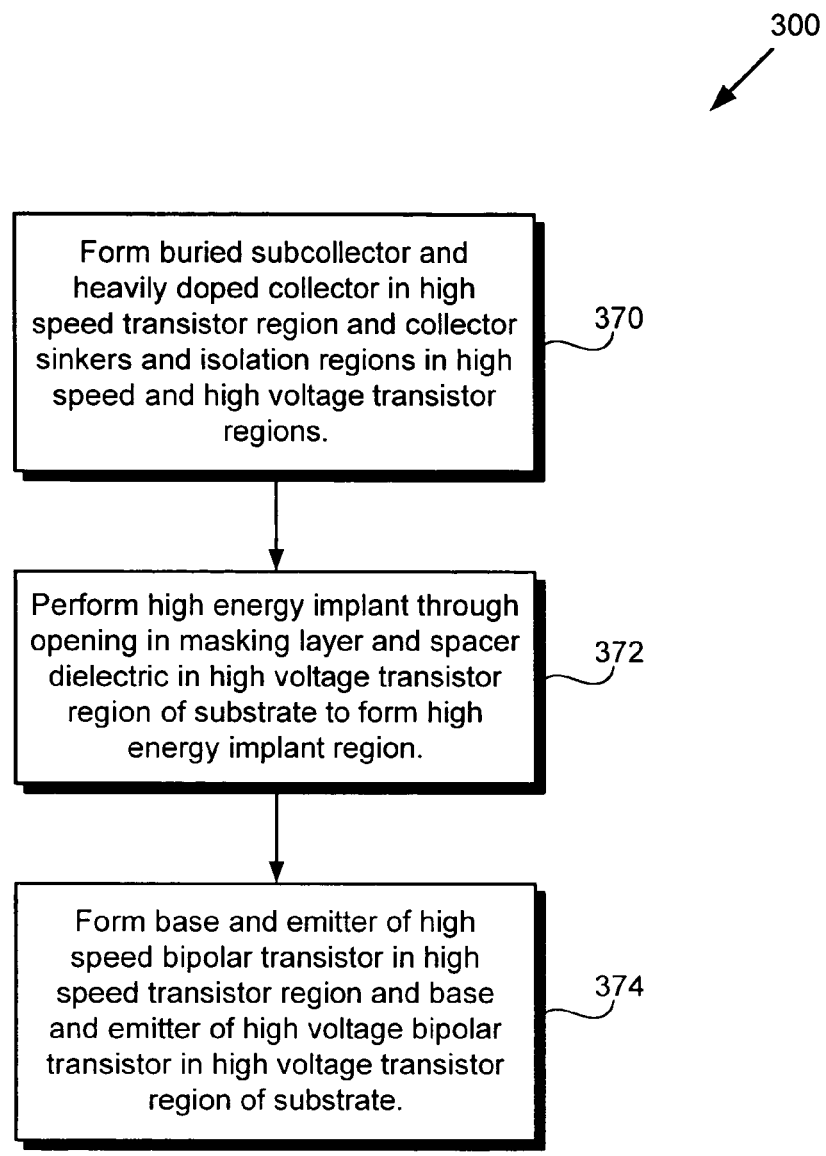
FIG. 3 shows a flowchart illustrating the steps taken to implement an embodiment of the present invention.

FIG. 3 shows a flowchart illustrating an exemplary method according to an embodiment of the present invention. Certain details and features have been left out of flowchart 300 that are apparent to a person of ordinary skill in the art. For example, a step may consist of one or more substeps or may involve specialized equipment or materials, as known in the art. Steps 370 through 374 indicated in flowchart 300 are sufficient to describe one embodiment of the present invention, other embodiments of the invention may utilize steps different from those shown in flowchart 300. It is noted that the processing steps shown in flowchart 300 are performed on a wafer, which, prior to step 370, includes a silicon substrate having high speed transistor region for fabricating high speed bipolar transistors and a high voltage transistor region for fabricating high voltage bipolar transistors. It is also noted that, prior to step 370, the silicon substrate can also include a CMOS region (not shown in any of the figures) for CMOS transistor fabrication.

Figure 4A:
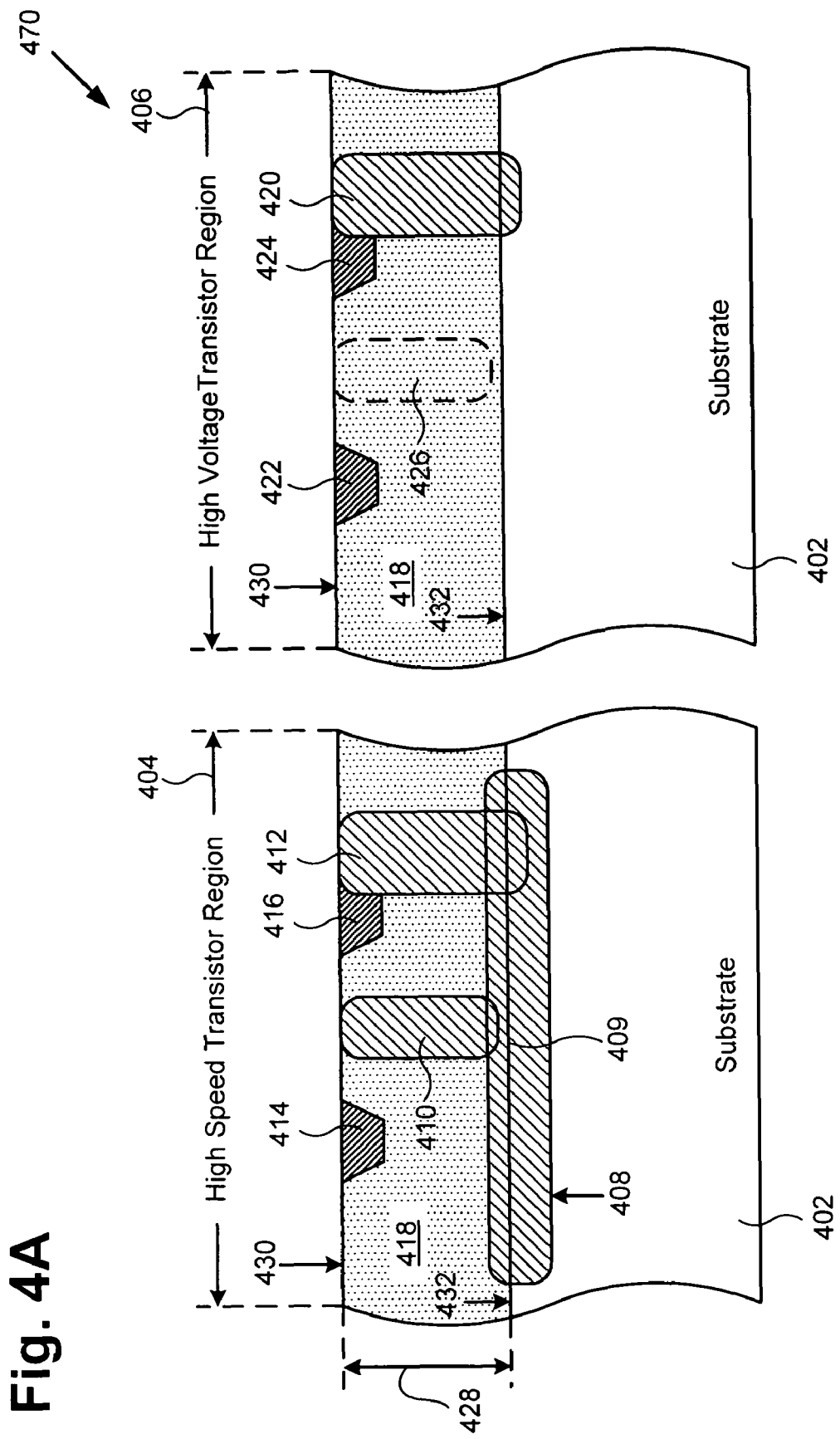
FIG. 4A illustrates a cross-sectional view, which includes a portion of a wafer processed according to an embodiment of the invention, corresponding to an initial step in the flowchart in FIG. 3.
Figure 4B:
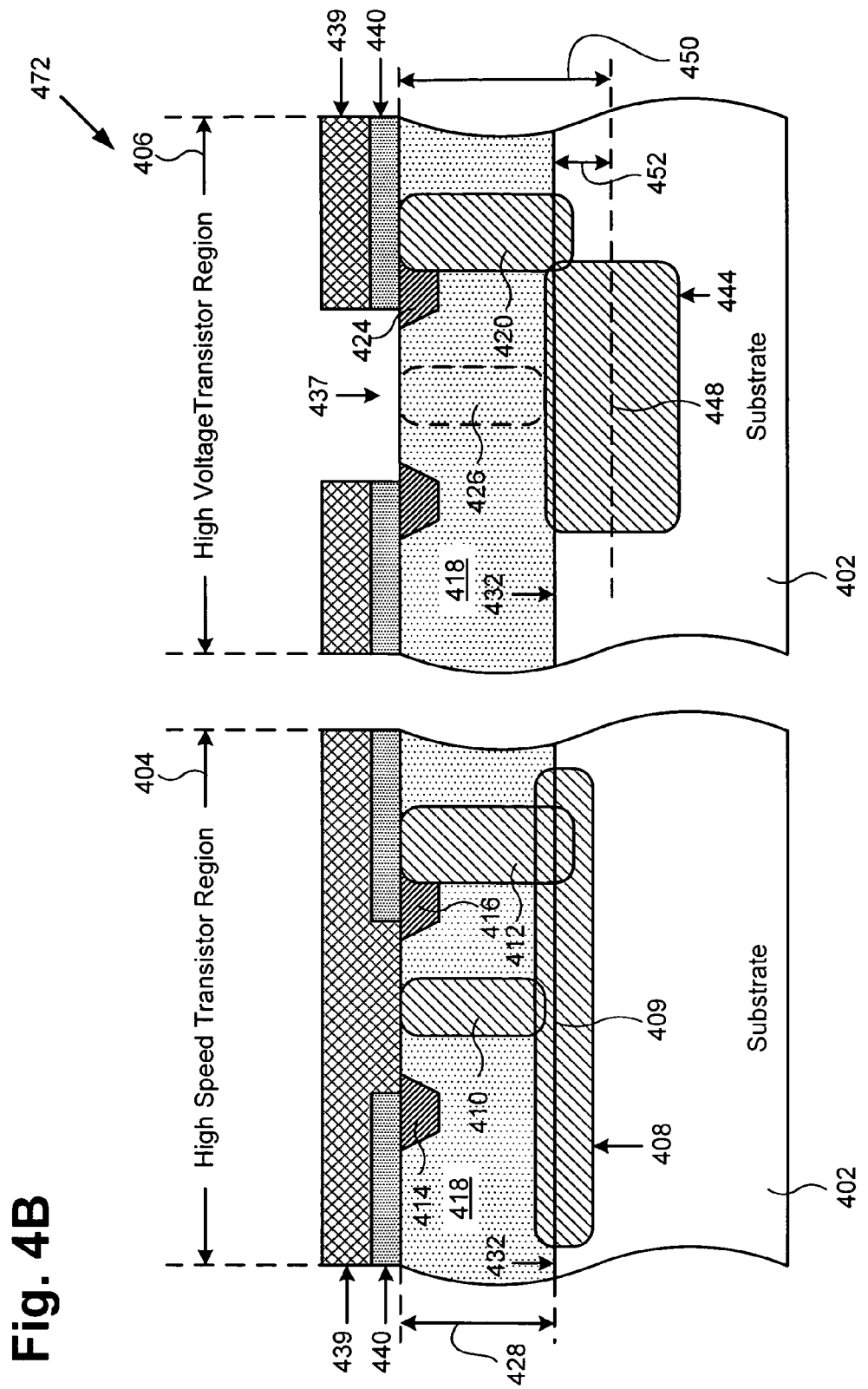
FIG. 4B illustrates a cross-sectional view, which includes a portion of a wafer processed according to an embodiment of the invention, corresponding to an intermediate step in the flowchart in FIG. 3.
Figure 4C:
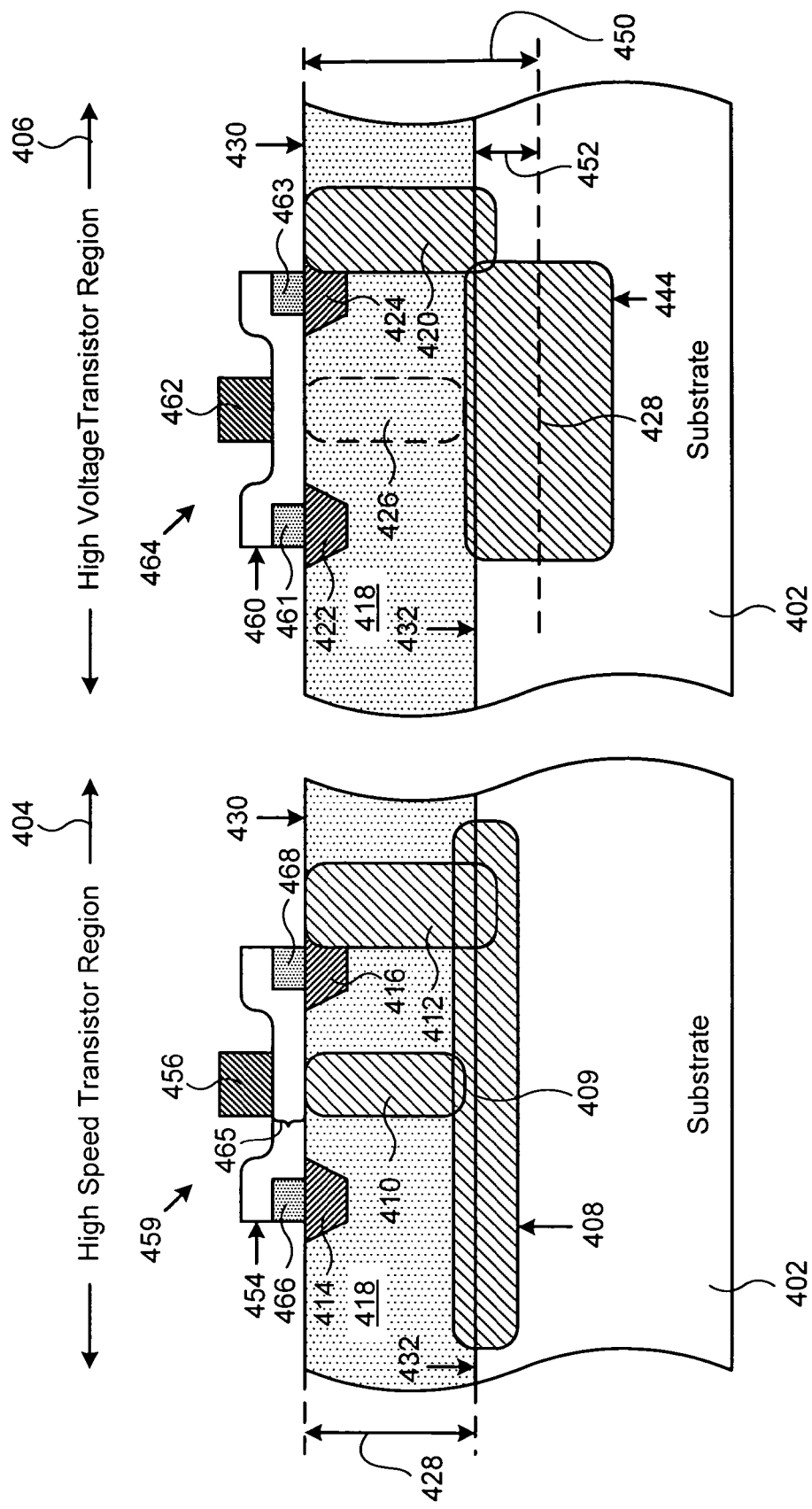
FIG. 4C illustrates a cross-sectional view, which includes a portion of a wafer processed according to an embodiment of the invention, corresponding to a final step in the flowchart in FIG. 3.

Moreover, structures 470 through 474 in FIGS. 4A through 4C illustrate the result of performing, on the semiconductor structure discussed above, steps 370 through 374 of flowchart 300, respectively. For example, structure 470 shows the semiconductor structure discussed above after processing step 370, structure 472 shows structure 470 after the processing of step 372, and so forth. It is noted that although formation of only one high speed bipolar transistor and only one high voltage bipolar transistor are specifically discussed herein to preserve brevity, multiple high speed and high voltage bipolar transistors can be formed in respective high speed and high voltage transistor regions of a silicon substrate utilizing the innovative process of the present invention. Also, in the embodiment of the invention in FIG. 3, steps 370 and 374 in flowchart 300 are substantially similar to steps 170 and 174 in flowchart 100 in the embodiment of the invention in FIG. 1.

Referring now to FIG. 4A, structure 470 of FIG. 4A shows an exemplary structure including a silicon substrate that includes high speed and high voltage transistor regions, after completion of step 370 of flowchart 300 in FIG. 3. In structure 470, substrate 402 includes high speed transistor region 404 for fabricating high speed bipolar transistors, such as high speed SiGe HBTs, and high voltage transistor region 406 for fabricating high voltage bipolar transistors, such as high voltage SiGe HBTs.

Referring now to step 370 in FIG. 3 and structure 470 in FIG. 4A, at step 370 of flowchart 300, buried subcollector 408, a heavily doped collector (i.e. collector 410), collector sinker 412, and isolation regions 414 and 416 are formed in high speed transistor region 404 and collector sinker 420 and isolation regions 422 and 424 are formed in high voltage transistor region 406. In FIG. 4A, substrate 402, buried subcollector 408, collector 410, collector sinkers 412 and 420, epitaxial layer 418, isolation regions 414, 416, 422, and 424, and thickness 428 correspond, respectively, to substrate 202, buried subcollector 208, collector 210, collector sinkers 212 and 220, epitaxial layer 218, isolation regions 214, 216, 222, and 224, and thickness 228 in FIG. 2A.

As shown in FIG. 4A, epitaxial layer 418 is situated over substrate 402 in high speed transistor region 404 and high voltage transistor region 406 and has thickness 428, which can be selected to be sufficiently thin so as to enable a high speed bipolar transistor having an $F_T$ (cutoff frequency) approximately equal to 200.0 MHz or greater to be formed in high speed transistor region 404. Also shown in FIG. 4A, collector 426 is situated in epitaxial layer 418 in high voltage transistor region 406 and comprises a portion of epitaxial layer 418 situated between isolation regions 422 and 424. In the present embodiment, collector 426 is a lightly doped N type collector comprising substantially the same concentration of N type dopant as epitaxial layer 418. Thus, in the present embodiment, collector 426 does not receive any additional collector doping via a local collector implant. In one embodiment, collector 426 can comprise a higher concentration of N type dopant than epitaxial layer 418.

Further shown in FIG. 4A, buried subcollector 408 is situated in substrate 402 and extends into epitaxial layer 418 and can be heavily doped with an N type dopant. Buried subcollector 408 has peak dopant concentration 409, which is situated close to top surface 432 of substrate 402 (or bottom surface 432 of epitaxial layer 418). Buried subcollector 408 has an intended depth below top surface 430 of epitaxial layer 418 that is approximately equal to thickness 428 of epitaxial layer 418, which corresponds to the depth of peak dopant concentration 409. Also shown in FIG. 4A, collector 410 is situated in epitaxial layer 418 in high speed transistor region 404 and comprises a heavily doped N type region.

Further shown in FIG. 4A, collector sinkers 412 and 420 are situated in epitaxial layer 418 in respective high speed and high voltage transistor regions 404 and 406 and can comprise heavily doped N type regions. Collector sinker 412 is electrically connected to collector 410 by buried subcollector 408 and collector sinker 420 is electrically connected to collector 426 by a subsequently formed high energy implant region. Also shown in FIG. 4A, isolation regions 414 and 416 are situated in epitaxial layer 418 in high speed transistor region 404 and isolation regions 422 and 424 are situated in epitaxial layer 418 in high voltage transistor region 406. Isolation regions 414 and 416 define an active area for formation of a high speed bipolar transistor, such as a high speed SiGe NPN transistor, in high speed transistor region 404 and isolation regions 422 and 424 define an active area for formation of a high voltage bipolar transistor, such as a high voltage SiGe NPN transistor, in high voltage transistor region 406. The result of step 370 of flowchart 300 is illustrated by structure 470 in FIG. 4A.

Referring now to step 372 in FIG. 3 and structure 472 in FIG. 4B, at step 372 of flowchart 300, a high energy implant comprising a high dose of N type dopant is performed through opening 437 in masking layer 439 and spacer dielectric 440 in high voltage transistor region 406 of substrate 402 to form high energy implant region 444. Masking layer 439 prevents the formation of a high energy implant region in high speed transistor region 404. Thus, in contrast to the embodiment of the invention in FIGS. 1 and 2A through 2C, in the embodiment of the invention in FIGS. 3 and 4A through 4C a high energy implant region is formed only in the high voltage transistor region. In FIG. 4B, high energy implant region 444, peak dopant concentration 448, depth 450, and depth 452 correspond, respectively, to high energy implant region 244, peak dopant concentration 248, depth 250, and depth 252 in FIG. 2B.

As shown in FIG. 4B, high energy implant region 244 is situated below collector 426 in substrate 402 in high voltage transistor region 406 and can diffuse into epitaxial layer 418. High energy implant region 444 comprises a heavily doped N type region including peak dopant concentration 448, which is situated at depth 450 below top surface 430 of epitaxial layer 418 and at depth 452 below top surface 432 of substrate 402. Depth 450 can be selected to enable peak dopant concentration 448 to be situated sufficiently below top surface 432 of substrate 402 such that a subsequently formed high voltage bipolar transistor, such as a high voltage SiGe NPN transistor, in high voltage transistor region 406 has a $BV_{CEO}$ greater than 5.0 volts.

Also shown in FIG. 4B, spacer dielectric 440 is situated over epitaxial layer 418 and masking layer 439 is situated over spacer dielectric 440 in high speed and high voltage transistor regions 404 and 406. Spacer dielectric 440, which is substantially similar in composition, thickness, and formation as spacer dielectric 240 in FIG. 2B, can be utilized to form spacers in a CMOS region (not shown in any of the figures) of substrate 402. Masking layer 439 can comprise photoresist or other suitable masking material and can be deposited over spacer dielectric 440 in a manner know in the art. After spacer dielectric 440 has been patterned to form openings in high speed and high voltage transistor regions 404 and 406 for subsequent base layer formation, masking layer 439 can be deposited over spacer dielectric 440 and patterned to form opening 437 in high voltage transistor region 406.

After opening 437 has been formed, high energy implant region 444 can be formed by implanting a high dose of N type dopant at high implant energy into substrate 402 through opening 437. For example, a dose of N type dopant of approximately $10^{14}$ ions per $cm^2$ can be implanted through opening 437 in the high energy, high dose implant. For example, an implant energy of approximately 1.0 megavolt can be utilized in the high energy, high dose implant. In high voltage transistor region 406, high energy implant region 444 forms an implanted subcollector and provides an electrical connection between collector 426 of a subsequently formed high voltage bipolar transistor and collector sinker 420. The result of step 372 of flowchart 300 is illustrated by structure 472 in FIG. 4B.

Referring now to step 374 in FIG. 3 and structure 474 in FIG. 4C, at step 374 of flowchart 300, base 454 and emitter 456 of high speed bipolar transistor 459 are formed in high speed transistor region 404 of substrate 402 and base 460 and emitter 462 of high voltage bipolar transistor 464 are formed in high voltage transistor region 406 of substrate 402. In FIG. 4C, bases 454 and 460, emitters 456 and 462, high voltage bipolar transistor 464, and spacer dielectric segments 461, 463, 466, and 468 correspond, respectively, to bases 254 and 260, emitters 256 and 262, high voltage bipolar transistor 264 and spacer dielectric segments 261, 263, 266, and 268 in FIG. 2C.

As shown in FIG. 4C, base 454 is situated over collector 410 and over spacer dielectric segments 466 and 468 in high speed transistor region 404 and base 460 is situate over collector 426 and spacer dielectric segments 461 and 463 in high voltage transistor region 206. Bases 254 and 260 can each comprise, for example, SiGe, which can be doped with boron or other suitable P type dopant, and have thickness 465. In one embodiment, bases 454 and 460 can each comprise a semiconductor material other than SiGe. Thickness 465 of base 454 can be appropriately selected to enable high speed bipolar transistor 459 to achieve an $F_T$ (cutoff frequency) of approximately 200.0 MHz or greater. Also shown in FIG. 4C, emitter 456 is situated over base 454 in high speed transistor region 404 and emitter 462 is situated over base 460 in high voltage transistor region 406. Thus, in the present embodiment, high speed bipolar transistor 459, which comprises emitter 456, base 454, and collector 410, is formed in high speed transistor region 404 and high voltage bipolar transistor 464, which comprises emitter 462, base 460, and collector 426, is formed in high voltage transistor region 406. The result of step 374 of flowchart 300 is illustrated by structure 474 in FIG. 4C.

In the embodiment in FIGS. 3 and 4A through 4C, by appropriately selecting thickness 428 of epitaxial layer 418 and thickness 465 of base 454 and forming a heavily doped collector (i.e. collector 410), high speed bipolar transistor 459 can provide an $F_T$ of approximately 200.0 MHz or greater and a $BV_{CEO}$ (collector-to-emitter breakdown voltage) of approximately 1.8 volts. In contrast to high speed bipolar transistor 258 in FIG. 2C, high speed bipolar transistor 459 does not include a high energy implant region, such as high energy implant region 242 in FIGS. 2B and 2C. As a result, high speed bipolar transistor 459 can provide an insignificantly higher $F_T$ than high speed bipolar transistor 258 in the embodiment in FIGS. 1 and 2A through 2C. However, high speed bipolar transistor 459 can provide a slightly higher maximum frequency ($F_{MAX}$) compared to high speed bipolar transistor 258. For example, high speed bipolar transistor 459 can provide $F_{MAX}$ of approximately 200.0 GHz compared to an $F_{MAX}$ of approximately 180.0 GHz for high speed bipolar transistor 258. Also, the embodiment of the invention in FIGS. 3 and 4A through 4C requires an additional masking layer that is not required in the embodiment of the invention in FIGS. 1 and 2A through 2C.

By forming high energy implant region 444 under a very lightly doped collector (i.e. collector 426) in place of a conventional buried subcollector, such as buried subcollector 442, and selecting depth 450 of peak dopant concentration 448 of high energy implant region 444 to be sufficiently below top surface 432 of substrate 402, an embodiment of the invention's high voltage bipolar transistor 464 can provide a $BV_{CEO}$ greater than 5.0 volts and an $F_T$ of approximately 45.0 MHz. In one embodiment, high voltage bipolar transistor 465 can provide a $BV_{CEO}$ of between approximately 5.5 volts and approximately 6.0 volts.

Thus, by utilizing a high energy implant region (e.g. high energy implant region 244), which forms an implanted subcollector, in place of a conventional buried subcollector (e.g. buried subcollector 208), the embodiment of the invention in FIGS. 3 and 4A through 4C provides similar advantages as the aforementioned embodiment of the invention in FIGS. 1 and 2A through 2C.

Thus as discussed above, by utilizing a high energy implant region for an implanted subcollector in place of a conventional buried subcollector, embodiments of the invention in FIGS. 1 and 2A through 2C and FIGS. 3 and 4A through 4C advantageously achieve integration of a high speed bipolar transistor having an $F_T$ of approximately 200.0 MHz or greater with a high voltage bipolar transistor having a $BV_{CEO}$ greater than 5.0 volts on the same semiconductor substrate. Also, in the embodiment of the invention in FIGS. 1 and 2A, no additional masking layers are required to integrate the high speed and high voltage bipolar transistors on the same semiconductor substrate, while only one additional masking layer is required in the embodiment of the invention in FIGS. 3 and 4A through 4C. Thus, the invention advantageously integrates a high speed bipolar transistor having an $F_T$ of approximately 200.0 MHz or greater with a high voltage bipolar transistor having a $BV_{CEO}$ greater than 5.0 volts on the same semiconductor substrate without significantly increasing manufacturing cost.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A method for integrating a high speed bipolar transistor in a high speed transistor region of a substrate with a high voltage bipolar transistor in a high voltage transistor region of said substrate, said method comprising steps of:
    forming a buried subcollector in said high speed transistor region of said substrate;
    forming a first high energy implant region in said high voltage transistor region of said substrate, said first high energy implant region extending to a depth greater than a depth of a peak dopant concentration of said buried subcollector, thereby increasing a collector-to-emitter breakdown voltage of said high voltage transistor;
    forming said high voltage bipolar transistor over said substrate;
    forming an emitter over all material layers used to form a collector for said high voltage bipolar transistor.

2. The method of claim 1, wherein said high speed bipolar transistor and said high voltage bipolar transistor are formed in an epitaxial layer situated over said substrate.

3. The method of claim 2, wherein said peak dopant concentration of said buried subcollector occurs near a bottom surface of said epitaxial layer.

4. The method of claim 1, wherein said collector-to-emitter breakdown voltage of said high voltage transistor is greater than approximately 5.0 volts.

5. The method of claim 1, wherein said high speed bipolar transistor has a cutoff frequency of greater than approximately 200.0 GHz.

6. The method of claim 2, wherein said epitaxial layer is formed over said substrate prior to said step of forming said first high energy implant region.

7. The method of claim 1 further comprising a step of forming a second high energy implant region in said high speed transistor region of said substrate.

8. The method of claim 7, wherein said second high energy implant region is formed during formation of said first high energy implant region.

9. The method of claim 7, wherein said second high energy implant region is formed using a same mask used to form said first high energy implant region.

10. The method of claim 2, wherein said collector for said high voltage bipolar transistor comprises a lightly doped collector situated in said epitaxial layer and electrically connected to said first high energy implant region.

11. The method of claim 10, wherein said lightly doped collector comprises a dopant concentration approximately equal to a dopant concentration of said epitaxial layer.

12. The method of claim 2, wherein said high speed bipolar transistor comprises a heavily doped collector situated in said epitaxial layer and electrically connected to said buried subcollector.

13. The method of claim 12 further comprising a step of forming a base comprising silicon germanium over said heavily doped collector in said high speed transistor region of said substrate.

14. A semiconductor die having a substrate with a high speed transistor region and a high voltage transistor region and an epitaxial layer overlying said substrate, said semiconductor die comprising:
    a high speed bipolar transistor situated in said high speed transistor region, said high speed bipolar transistor comprising a buried subcollector;
    a high voltage bipolar transistor situated in said high voltage transistor region, said high voltage bipolar transistor comprising a first high energy implant region;
    said first high energy implant region extending to a depth greater than a depth of a peak dopant concentration of said buried subcollector, thereby increasing a collector-to-emitter breakdown voltage of said high voltage transistor;
    an emitter formed over all material layers used to form a collector for said high voltage bipolar transistor.

15. The semiconductor die of claim 14, wherein said high speed bipolar transistor and said high voltage bipolar transistor are situated in said epitaxial layer.

16. The semiconductor die of claim 14, wherein said peak dopant concentration of said buried subcollector occurs near a bottom surface of said epitaxial layer.

17. The semiconductor die of claim 14, wherein said high speed bipolar transistor further comprises a second high energy implant region, wherein said second high energy implant region extends to a depth greater than said depth of said peak dopant concentration of said buried subcollector.

18. The semiconductor die of claim 14, wherein said collector for said high voltage bipolar transistor comprises a lightly doped collector situated in said epitaxial layer and electrically connected to said first high energy implant region.

19. The semiconductor die of claim 18, wherein said lightly doped collector comprises a dopant concentration approximately equal to a dopant concentration of said epitaxial layer.

20. The semiconductor die of claim 14, wherein said high speed bipolar transistor is a silicon germanium heterojunction bipolar transistor.

* * * * *